US009170312B2

(12) United States Patent
Larson et al.

(10) Patent No.: US 9,170,312 B2
(45) Date of Patent: Oct. 27, 2015

(54) PHASE-SENSITIVE IMAGING OF MAGNETIZATION EXCHANGE AND ISOTOPE FLUX

(75) Inventors: Peder Larson, Redwood City, CA (US);
Adam B. Kerr, Menlo Park, CA (US);
John M. Pauly, Stanford, CA (US);
Daniel B. Vigneron, Corte Madera, CA (US)

(73) Assignees: The Board of Trustees of the Leland Stanford Junior University, Palo Alto, CA (US); The Regents of the University of California, Oakland, CA (US)

( * ) Notice: Subject to any disclaimer, the term of this patent is extended or adjusted under 35 U.S.C. 154(b) by 945 days.

(21) Appl. No.: 13/360,510

(22) Filed: Jan. 27, 2012

(65) Prior Publication Data
US 2013/0193966 A1    Aug. 1, 2013

(51) Int. Cl.
*G01V 3/00*    (2006.01)
*G01R 33/46*    (2006.01)
*G01R 33/563*    (2006.01)
*G01R 33/485*    (2006.01)
*G01R 33/56*    (2006.01)

(52) U.S. Cl.
CPC ........ *G01R 33/4608* (2013.01); *G01R 33/4616* (2013.01); *G01R 33/485* (2013.01); *G01R 33/5601* (2013.01); *G01R 33/5605* (2013.01); *G01R 33/56333* (2013.01)

(58) Field of Classification Search
CPC .................................................. G01R 33/56333
USPC .................................... 324/306, 307, 309, 314
See application file for complete search history.

(56) References Cited

U.S. PATENT DOCUMENTS

| | | | |
|---|---|---|---|
| 5,682,883 A * | 11/1997 | Fiat .............................. | 600/323 |
| 7,772,844 B2 | 8/2010 | Hurd | |
| 8,791,699 B2 * | 7/2014 | Hernandez-Garcia et al. ............................ | 324/309 |
| 8,958,866 B2 * | 2/2015 | Bolar et al. ................... | 600/419 |
| 8,965,480 B2 * | 2/2015 | Jung et al. ..................... | 600/419 |
| 2010/0283465 A1 | 11/2010 | Hurd | |

OTHER PUBLICATIONS

Zhao et al., "Gradient-Echo Imaging Considerations for Hyperpolarized $^{129}$Xe MR," Journal of Magnetic Resonance, Series B 113, Article No. 0173, pp. 179-183, 1996.
Pauly et al., "Parameter Relations for the Shinnar-Le Roux Selective Excitation Pulse Design Algorithm," IEEE Transactions on Medical Imaging, vol. 10, No. 1, pp. 53-65, Mar. 1991.
Karam et al., "Complex Chebyshev Approximation for FIR Filter Design," IEEE Transactions on Circuits and Systems II: Analog and Digital Signal Processing, vol. 42, No. 3, pp. 207-216, Mar. 1995.

* cited by examiner

*Primary Examiner* — Louis Arana
(74) *Attorney, Agent, or Firm* — Beyer Law Group LLP

(57) ABSTRACT

A method for imaging a substrate and product over time is provided. The substrate and product are magnetically tagged with at least one magnetic gradient where magnetically tagging provides a tag-dependent signal phase for the substrate and a different tag-dependent signal phase for the product. At least one readout of magnetically tagged substrate and product is provided over time. The tag-dependent signal phase is used to determine product that has been transformed from magnetically tagged substrate and substrate that has been transformed from magnetically tagged product over time.

16 Claims, 6 Drawing Sheets

PHASE-SENSITIVE IMAGING OF MAGNETIZATION EXCHANGE AND ISOTOPE FLUX

GOVERNMENT RIGHTS

This invention was made with Government support under contract EB007588 awarded by the National Institutes of Health, under contract EB012064 awarded by the National Institutes of Health, under contract CA111291 awarded by the National Institutes of Health, and under contract RR009784 awarded by the National Institutes of Health. The Government has certain rights in this invention.

FIELD OF THE INVENTION

The present invention relates generally to magnetic resonance imaging (MRI). More particularly, the present invention relates to MRI using phase sensitive imaging.

BACKGROUND

Magnetic resonance imaging (MRI) is a non-destructive method for the analysis of materials and represents a relatively new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

SUMMARY OF THE DESCRIBED EMBODIMENTS

In accordance with the invention, a method for imaging a substrate and product over time is provided. The substrate and product are magnetically tagged with at least one magnetic gradient where magnetically tagging provides a tag-dependent signal phase for the substrate and a different tag-dependent signal phase for the product. At least one readout of magnetically tagged substrate and product is provided over time. The tag-dependent signal phase is used to determine product that has been transformed from magnetically tagged substrate and substrate that has been transformed from magnetically tagged product over time.

The invention and objects and features thereof will be more readily apparent from the following detailed description and appended claims when taken in conjunction with the drawings.

DETAILED DESCRIPTION OF EXAMPLE EMBODIMENTS

Figure 1:
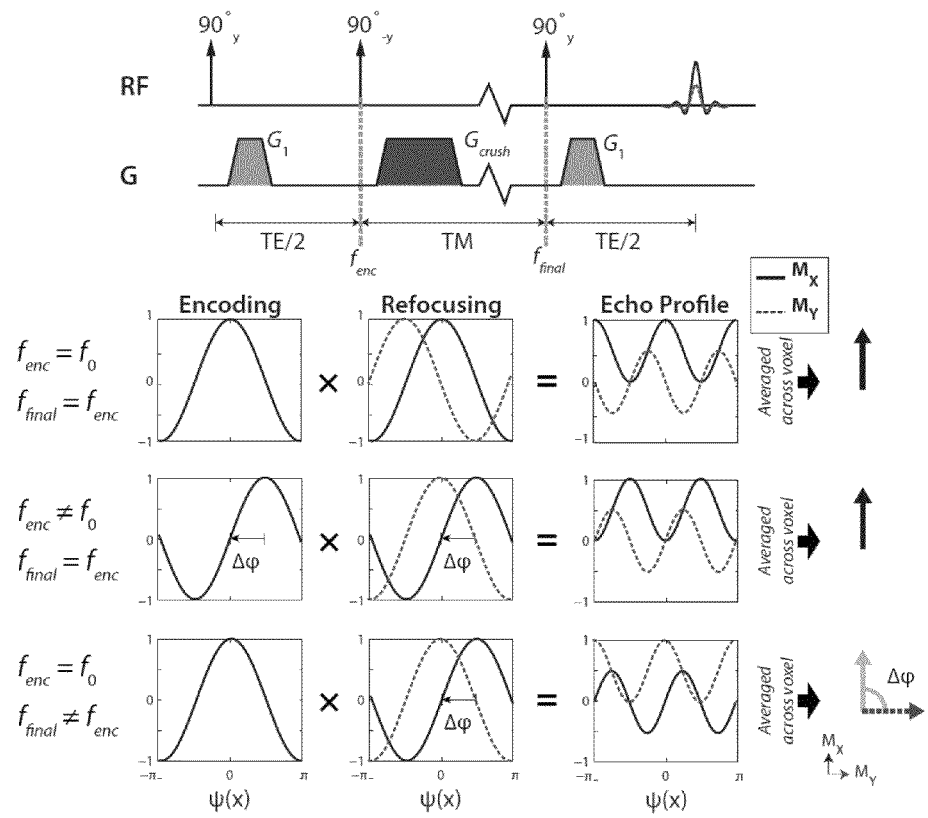
FIG. 1 shows the effect of exchange or flux during the mixing time of a stimulated-echo.

Reference will now be made in detail to a particular embodiment of the invention, an example of which is illustrated in the accompanying drawings. While the invention will be described in conjunction with the particular embodiment, it will be understood that it is not intended to limit the invention to the described embodiment. To the contrary, it is intended to cover alternatives, modifications, and equivalents as may be included within the spirit and scope of the invention as defined by the appended claims.

Hyperpolarized $^{13}$C magnetic resonance imaging (MRI) provides the unique ability to non-invasively probe in vivo metabolism. It has significant potential to improve the detection and characterization of cancer in individual patients. Pre-clinical studies in tumor models have been very promising. The novel metabolic information this technique provides may have clinical applications beyond cancer to other metabolic disorders, such as diabetes, ischemic heart disease, stroke, and inflammation. This information can be used to determine the severity of disease, as well as monitor the progression and response to therapy in individual patients.

It provides several advantages when compared to other imaging approaches. X-ray and computed tomography (CT) imaging require ionizing radiation and provide strictly anatomical and no metabolic information. Positron emission tomography (PET), widely used in clinical oncology, shows the injected tracer uptake, but has limited ability to image metabolic pathways the tracer could enter. Furthermore, PET tracers emit ionizing radiation which has adverse effects on biological tissues. In hyperpolarized MRI, chemical shift is detected which allows for imaging of multiple metabolic pathways, and uses no ionizing radiation. The hyperpolarization process can increase the injected substrate signal more than 10,000-fold, which provides sensitivity improvements over conventional MRI or MR spectroscopy (MRS). Furthermore, using hyperpolarized injected agents probes regions of active cellular metabolism, while conventional MRI/MRS can be confounded by signal from inactive pools of metabolites.

The value of hyperpolarized $^{13}$C MRI is in its ability to observe in vivo metabolic conversion, as this enables unprecedented tissue characterization. Following injection of the hyperpolarized contrast, the observed signal is affected not only by cellular metabolism, but also by vascular components, agent delivery, and transport in and out of cells. The purpose of one embodiment of the invention is to directly observe localized active cellular metabolism and distinguish it from these other biological processes. For this reason, one embodiment of the invention is called Metabolic Activity Decomposition Stimulated-echo Acquisition Mode, or MAD-STEAM.

An embodiment of the invention is applicable for MRI and MRS following injection of hyperpolarized substrates that undergo metabolic conversion in vivo. Hyperpolarized [1-$^{13}$C]-pyruvate has been the most widely used substrate thus far because it is chemically well-suited for hyperpolarization and undergoes differential conversion to [1-$^{13}$C]-lactate and [1-$^{13}$C]-alanine in vivo, which is implicated in many disease processes. Various embodiments of the invention can be applied to other hyperpolarized substrates as well, such as [1,4$^{13}$C]-fumarate, [2-$^{13}$C]-fructose, and [5-$^{13}$C]-glutamine, all of which have been shown to undergo metabolic conversion in vivo.

The primary anticipated clinical application of this embodiment of the invention is for assessment and characterization of cancer tissue. This embodiment of the invention can provide an unprecedented direct measurement of the cellular metabolism while suppressing vascular components and reducing sensitivity to agent delivery. The novel metabolic information may also be beneficial for other metabolic disorders, such as diabetes, ischemic heart disease, stroke, and inflammation. In all of these applications, detection of the tissue metabolic profile enables evaluation of disease severity, aggressiveness and has been shown to allow for early, non-invasive detection of response to therapeutic treatments.

This invention can also be applied to hyperpolanzed $^{129}$Xe gas imaging, which has been used for evaluation of lung function, detection blood oxygenation, and may provide enhanced protein structure information. In vivo, the chemical shift of $^{129}$Xe is very sensitive to the local environment. For example, these molecules have distinct chemical shifts depending on whether the spins are in a gas phase, dissolved in blood, or bound to hemoglobin. This embodiment of the invention allows for direct observation of molecules transitioning between these and other local environments. Applied to lung function imaging, this could provide improved evaluation of lung function by monitoring the transition of hyperpolarized $^{129}$Xe molecules between the lung space, lung parenchyma, and blood.

Of the MRI and MRS approaches tailored to metabolic imaging with hyperpolarized substrates, none offer the ability of the embodiment of the invention to directly distinguish active metabolic conversion. Approaches that acquire data at a single time-point include a mixture of undesired signal components in addition to the metabolic conversion of interest. These include vascular components as well as agent delivery sensitivity. The observed metabolites likely include components that originated in other tissues or in the blood ([1-$^{13}$C]-lactate is produced in red blood cells) and flowed into the voxel, which are not representative of tissue metabolism. For example, we know that a substantial portion of the high levels of [1-$^{13}$C]-lactate observed in the kidneys following [1-$^{13}$C]-pyruvate injection is from flowing metabolites, and not due to kidney metabolism.

Dynamic MRI and MRS approaches, which acquire time-resolved data, offer capabilities to observe flow and are an improvement over single time-point acquisitions. The flow can be estimated with the kinetics using modeling techniques. This approach can achieve limited temporal and spatial resolution, which in turn places restrictions on the stability of the modeling. Dynamic acquisitions provide only an indirect measure of metabolic conversion and thus can only estimate the various components. Exchange spectroscopy (EXSY) is a nuclear magnetic resonance (NMR)/MRS method was designed to observe exchange between compounds. It uses multiple experiments in which the encoding time (t1) is incremented in order to obtain a 2D spectra, and a multi-step phase-cycling scheme is used. This is not suitable for in vivo hyperpolarized imaging, where only a single encoding step is feasible because the magnetization is not replenished. Furthermore, the metabolic conversion must be captured in a relatively short imaging window of about 10 sec or less, which is difficult when many encoding steps are required. Compared to EXSY, MAD-STEAM requires only a single encoding step, a feature that is enabled by its phase-sensitive detection approach.

One of the key features of this embodiment of the invention is the phase-sensitive acquisition and reconstruction. Prior stimulated-echo based approaches, such as the stimulated-echo acquisition mode (STEAM) and spectrally-formed stimulated-echo, such as described in U.S. Pat. No. 7,772,844, entitled "System and Method For Tissue Specific MR Imaging of Metabolites Using Spectral-Spatially Formed Stimulated Echo," issued Aug. 10, 2010, to Ralph Hard, and U.S. patent application Ser. No. 12/844,876, entitled "System and Method For Tissue Specific MR Imaging of Metabolites Using Spectral-Spatially Formed Stimulated Echo," by Ralph Hard, which are incorporated by reference for all purposes, do not include a phase-sensitive separation of components. Furthermore, it is not obvious that this should be done, as stimulated-echo approaches have been in existence for over 20 years but with no published methods that use a phase-sensitive separation. The spectrally-formed stimulated-echo technique uses spectrally-selective encoding pulses, which only allows for observation of mono-directional metabolic conversion. The embodiment of the invention allows for observation of bi-directional metabolic conversion, for example, observing both pyruvate to lactate and lactate to pyruvate. Another difference from prior stimulated-echo based approaches is the use of variable phase profile RF pulses in one embodiment of this invention. This allows for phase-sensitive detection of multiple metabolic pathways, and is not done in any of these previous methods.

Magnetization exchange can also be indirectly observed with saturation or inversion magnetization transfer (MT). Quantifying the MT effect requires multiple acquisitions in order to separate prior and generated metabolite components, which are both directly detected in MAD-STEAM. In vivo, this approach does not account for flow effects, which could confound the interpretation of the metabolic profile. Flow is eliminated in an embodiment of the invention.

In summary, MAD-STEAM provides localized and direct measurements of metabolic conversion in a rapid approach that is suitable for hyperpolarized MRI. It eliminates effects from flow and, unlike previous approaches, MAD-STEAM uses a phase-sensitive detection to simultaneously observe the prior metabolic state and the metabolic conversion.

Another embodiment of the invention described below uses variable phase profile RF pulses, which increases the flexibility of this invention, facilitating phase-sensitive detection of multiple pathways. Another embodiment of the invention described below uses a super stimulated-echo approach, which replaces the initial 90-90 encoding pulses and accompanying gradient by an RF pulse train. This will improve the SNR by more efficiently encoding the magnetization.

Embodiments of the invention can be applied to other compounds and other nuclei beyond hyperpolarized [1-$^{13}$C]-pyruvate. Some other compounds include, but are not limited to, [1,4-$^{13}$C]-fumarate, [2$^{13}$C]-fructose, [5-$^{13}$C]-glutamine, all of which have been shown to undergo metabolic conversion in vivo. Other nuclei that can be studied include $^1$H, $^3$He, $^6$Li, $^{15}$N, $^{89}$Y, $^{129}$Xe, and more.

Furthermore, embodiments of the invention can even be applied to non-hyperpolarized molecules, provided they are undergoing metabolic conversion or exchange that is slower than the encoding time and RF pulse durations. The initial encoding will label the pre-existing pools of metabolites, and spins that exchange or convert to another compound will show up in the imaginary component of the received signal.

Embodiments of the invention can be used to image any change that results in a frequency shift during the mixing time. In addition to the above described phenomena (exchange, metabolic conversion, and metabolic flux), this includes changes in the local tissue environment of the labeled nuclei. For example, $^{129}$Xe, which can be hyperpolarized by optical pumping methods, is very sensitive to the local environment and has distinct chemical shifts depending on whether the spins are in free space, tissue, blood, and more.

The RF pulses in the MAD-STEAM sequence can be applied with accompanying gradients in order to be spatially-selective. In particular, one could use 3 orthogonal gradients with the 3 RF pulses for localization to a 3D box region.

The adiabatic spin-echo pulses shown could obviously be replaced by a single spin-echo pulse. They could also be eliminated completely. In this case, a symmetric echo can be acquired by lengthening TE to move the stimulated-echo. A one-sided echo can also be acquired, and would require additional reconstruction steps in order to separate the phased components of the signal.

The MAD-STEAM approach can also be combined with spectroscopic imaging approaches to provide maps of the metabolic conversion. This is done by using the encoding and refocusing described in this invention, with a readout gradient scheme such as echo-planar spectroscopic imaging or spiral chemical shift imaging.

The key new feature of some embodiments of the invention is the ability to detect magnetization exchange (such as metabolic conversion) between multiple compounds in a single encoding and acquisition step. All prior exchange detection MR methods rely on multiple encodings and/or multiple acquisitions. Some embodiments of the invention acquire the same information in a single step by placing the non-exchanged and exchanged components in the real and imaginary signal channels.

The irrecoverable signal loss in hyperpolarized MRI/MRS necessitates the use of a single encoding step. To our knowledge, no other hyperpolarized MR methods have been developed that can directly observe localized metabolic conversion in vivo.

Theory

The mechanism behind the MAD-STEAM method is illustrated in FIG. 1, which shows the effect of exchange or flux during the mixing time of a stimulated-echo, with spins that have $f_{enc}=f_{final}$ so that they are identically refocused in phase, whereas spins that change resonance frequency are refocused with a phase offset of $\Delta\phi$ according to equation 10. A $90°_y$-$90°_{-y}$ stimulated-echo encoding followed by a crusher results in the following encoding along $M_z$:

$$M_{enc}(\vec{x},f)=M_0\cos(\psi(\vec{x})+\phi(f))\hat{z} \quad (1)$$

where a spatial encoding is created by the gradient(s)

$$\psi(\vec{x})=\vec{k}(T)\cdot\vec{x} \quad (2)$$

$$\vec{x}(t)=\gamma\int_0^t \vec{G}(\tau)d\tau, \quad (3)$$

and the spectral encoding by the time delay $$\phi(f)=2\pi(f-f_0)TE/2, \quad (4)$$

where $f_0$ is the center frequency of the RF pulses. The final $90°_y$ rotates $M_{enc}$ onto $M_X$, which is followed by re-phasing interval and gradient that can be described as a multiplication of the complex magnetization, $m=M_X+iM_Y$:

$$R(\vec{x},f)=\exp(i(\psi(\vec{x})+\phi(f))). \quad (5)$$

The final magnetization is given by $$m_{final}(\vec{x},f) = M_{enc}(\vec{x},f)R(\vec{x},f) \quad (6)$$
$$= M_0[\cos^2(\psi(\vec{x})+\phi(f)) +$$
$$i\cos(\psi(\vec{x})+\phi(f))\sin(\psi(\vec{x})+\phi(f))]$$

Provided spatial modulation is sufficiently high across a voxel volume, V, this results in a received signal of $$S(f)=\int_V m_{final}(\vec{x},f)d\vec{x}=\int_{-\pi}^{\pi}m_{final}(\vec{x},f)d\psi(\vec{x})=\tfrac{1}{2}M_0 \quad (7)$$

which includes the inherent 50% signal loss in stimulated-echoes.

When exchange occurs during the mixing time such that the spins undergo a resonant frequency shift from $f_{enc}$ to $f_{final}$, we have $$m_{final}(\vec{x},f_{enc}\to f_{final}) = M_{enc}(\vec{x},f_{enc})R(\vec{x},f_{final}) \quad (8)$$
$$= 1/2M_0[\exp(i(2\psi(\vec{x})+$$
$$\phi(f_{enc})+\phi(f_{final})))+\ldots$$
$$\exp(i(\phi(f_{final})-\phi(f_{enc})))].$$

The first exponential term integrates to zero across $\vec{x}$, and results in a received signal of $$S(f_{enc}\to f_{final})=\tfrac{1}{2}M_0\exp(i\Delta\phi(f_{enc}\to f_{final})). \quad (9)$$

This has a phase shift that depends on the difference between the encoded and final frequencies:

$$\Delta\phi(f_{enc}\to f_{final})=\phi(f_{final})-\phi(f_{enc})=2\pi(f_{final}-f_{enc})TE/2. \quad (10)$$

Methods

Figure 2:
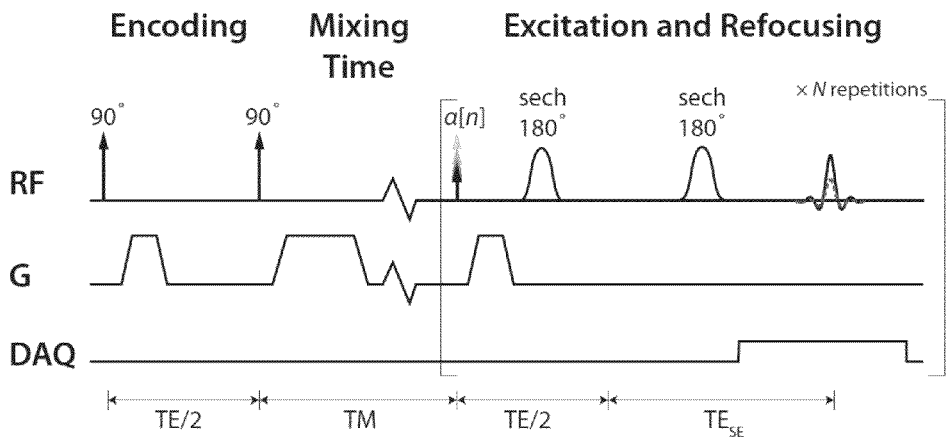
FIG. 2 shows the pulse sequence used in MAD-STEAM experiments using a single 90-90 encoding step.

FIG. 2 shows the pulse sequence used in MAD-STEAM experiments using a single 90-90 encoding step that was optionally followed by multiple excitations and a symmetrically sampled echo readout and which used a progressive flip angle α[n] to account for the depletion of hyperpolarized magnetization by previous RF pulses. The initial 90° pulses were non-selective, 504 μs rectangular pulses. The excitation pulses were 1.8 ms slab-selective pulses and used a progressive flip angle, α[n], as described in "Gradient-Echo Imaging Considerations For Hyperpolarized $^{129}$Xe MR," by Zhao et al. published in Journal of Magnetic Resonance B 1996, 113:179-183, which is incorporated by reference for all purposes, in order to equalize the signal across multiple readouts by adjusting for the depletion of hyperpolarized magnetization by previous RF pulses. While not required for detection of exchange, these multiple readouts allow for observation of the conversion kinetics.

Two non-selective adiabatic sech pulses, (associated crusher gradients not shown) were used to move the echo later in time. This enables improved phase sensitivity by symmetric sampling of the echo, which has narrow spectral linewidths in both the real and imaginary channels. In these experiments, $TE_{SE}=140$ ms.

The encoding gradient was applied on the Z axis. Its area was chosen as a balance of (a) providing at least several $2\pi$ cycles of phase accumulation across the slab size for appropriate averaging of the STE modulation, and (b) minimizing losses from diffusion-weighting for the TM range of interest.

The TE was chosen such that the conversion from pyruvate (pyr) to lactate (lac) creates a $\pm\pi/2$ phase shift so it is observed solely in the imaginary channel:

$$\Delta\phi_{pyr\to lac}=2\pi(f_{lac}-f_{pyr})\cdot TE/2=\pi/2\pm k\pi. \quad (11)$$

The reverse conversion will also show up in the imaginary channel since $\Delta\phi_{lac\to pyr} = -\Delta\phi_{pyr\to lac}$. The final chosen and emperically calibrated value was TE=14.0 ms for $\Delta\phi_{pyr\to lac}=5.5\pi$. In one experiment, TE=15.3 ms to put generated lactate in-phase ($\Delta\phi_{pyr\to lac}=6\pi$). Pre-saturation of lactate was performed in several experiments by applying 3 maximum-phase 20 ms saturation pulses with 150 Hz bandwidth. Pulse sequence timings were calibrated on a phantom containing [1-$^{13}$C]lactate and [1-$^{13}$C]acetate by removing any first-order spectral phase effects. $^{13}$C-urea was included in all experiments as a phase reference, and was used to determine the zero-order spectral phase correction.

Experiments

All animal studies were carried out under a protocol approved by our Institutional Animal Care and Use Committee. Experiments were performed on a GE 3 T clinical MRI system (GE Healthcare, Waukesha, Wis., USA) with 40 mT/m, 150 mT/m/ms gradients and a broadband RF amplifier. A custom built, dual-tuned mouse birdcage coil was used for RF transmission and signal reception. Compounds consisting of [1-$^{13}$C] pyruvic acid with the trityl radical (GE Healthcare, Oslo, Norway), and 99% $^{13}$C-urea (Sigma-Aldrich, St. Louis, Mo.) in glycerol (6.4 M) with the trityl radical OX063 (23 mM) (Oxford Instruments, UK), were simultaneously polarized in a HyperSense DNP system (Oxford Instruments, Abingdon, UK) at 3.35 T and a temperature of 1.3 K. The hyperpolarized compounds were dissolved to 80 mM (pyruvate) and 115 mM (urea), and 350 µL of this solution was injected into the animals over 12 seconds. The pH was monitored using the aliquot and other excess pyruvate.

Ex vivo metabolic assay experiments (N=3) were performed by adding the hyperpolarized solution to a syringe containing 25.56 units of lactate dehydrogenase (LDH) and 14 µM nicotinamide adenine dinucleotide (NADH) (Sigma-Aldrich, St. Louis, Mo.) dissolved in 2.5 mL phosphate buffer. This was mixed with 0.5 mL from the dissolved pyruvate and urea mixture, resulting in 8.5 µM pyruvate and 9.8 µM urea. The MAD-STEAM acquisition was initiated as soon as possible following mixing to capture the metabolic flux. Experiments were performed in normal mice and a transgenic adenocarcinoma of mouse prostate (TRAMP) mouse model. The MAD-STEAM encoding was initiated 20-25 sec after the start of injection.

Sources of Phase

MAD-STEAM is a phase-sensitive technique, and is thus also sensitive to other sources of phase in MR experiments. Coherent (but not turbulent) flow and other bulk motion will introduce a spatially-dependant phase, but which does not vary with frequency. RF amplifiers can have phase instability between excitations, and RF coils can also have spatially-dependant phase profiles. Timing offsets will introduce first order spectral phase.

Results

Figure 3:
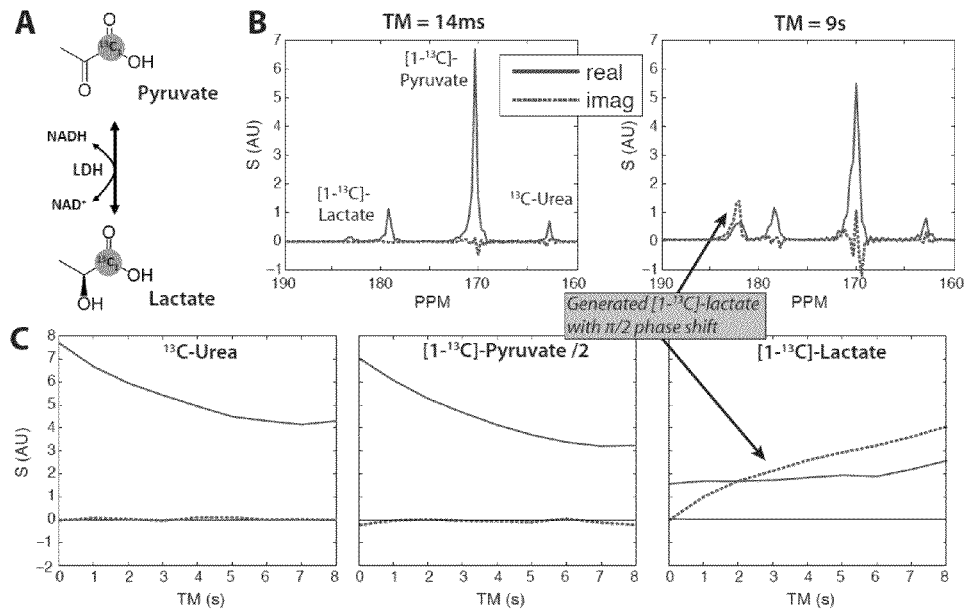
FIGS. 3A-C show spectra and dynamic time curves from a representative ex vivo assay experiment.

Spectra and dynamic time curves from a representative ex vivo assay experiment are shown in FIGS. 3A-C. FIG. 3A shows pyruvate to lactate conversion is mediated by the LDH enzyme and NAD cofactors. FIG. 3B shows spectra at first and last time points. FIG. 3C shows peak amplitude time courses. Lactate was partially suppressed prior to the experiment by pre-saturation pulses. These experiments validated the MAD-STEAM approach because all metabolites initially had the same phase, but the lactate generated through metabolic flux had the expected $$\frac{\pi}{2}$$

phase shift. The relatively flat real lactate signal is a result of the progressive flip angle used across TM, which compensates for RF magnetization losses. Increased SNR in final images maybe due to unique 2D slice profile effects with hyperpolarized nuclei.

Figure 4:
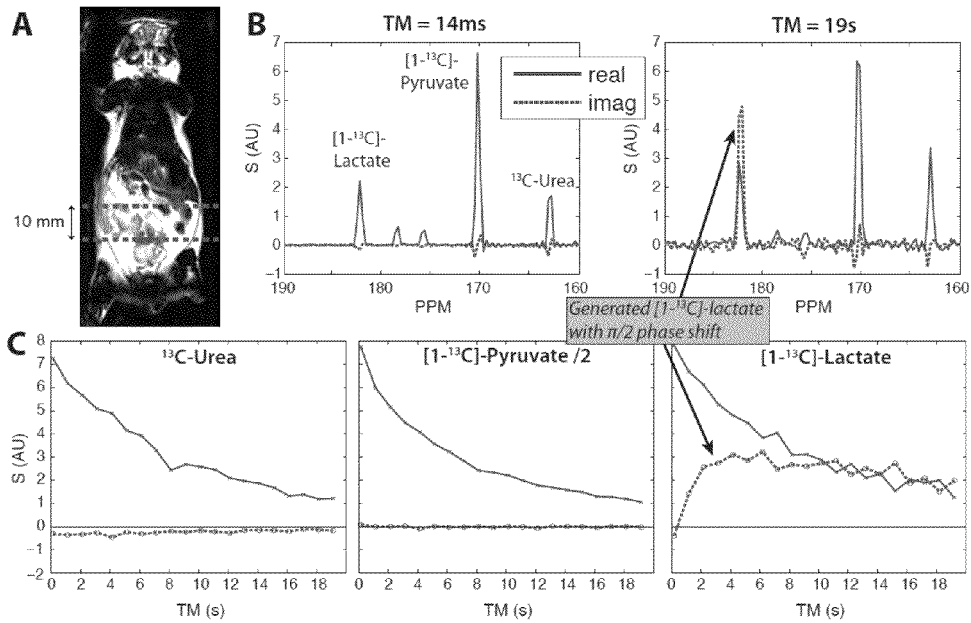
FIGS. 4A-C show experimental results in a normal mouse.

Experimental results in a normal mouse are shown in FIGS. 4A-C, where a gut slab was imaged because of its relatively high metabolic activity and where sequences started 20 seconds after the start of injection. FIG. 4A shows the slab location on a coronal image. FIG. 4B shows spectra at first and last time points. FIG. 4C shows peak amplitude time courses. The pyruvate and urea remain in the real channel throughout the 19 sec experiment, while the lactate shows a clear build-up of an imaginary component. By TM=10 sec, the lactate in the real (originally encoded) and imaginary (generated from pyruvate) components were approximately equal.

Figure 5:
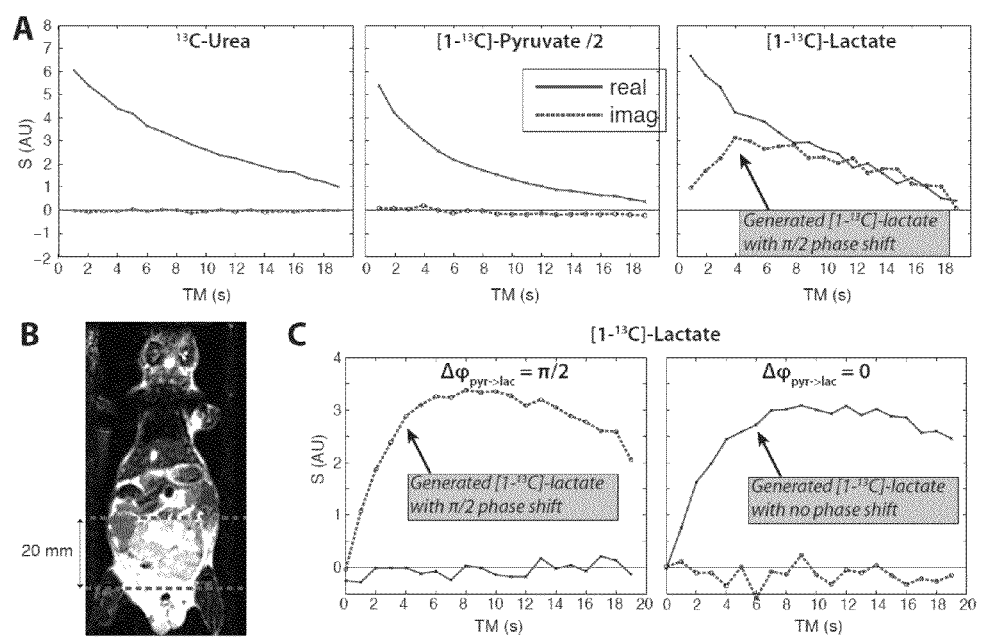
FIGS. 5A-C shows experimental results in a transgenic prostate tumor mouse model (TRAMP).

Similar results were also obtained in a transgenic prostate tumor mouse model (TRAMP), shown in FIGS. 5A-C, in which [1-$^{13}$C]-lactate has been demonstrated to be a biomarker of disease, disease progression, and response to therapy. The sequences started 25 seconds after the start of the injection. FIG. 5A shows the peak amplitude time courses. FIG. 5B shows the slab location on a coronal image. FIG. 5C shows lactate time courses with pre-saturation pulses. The experiment used TE=14.0 ms (left) and 15.3 ms (right) to modulate the phase of lactate generated from pyruvate ($\Delta\phi_{pyr\to lac}$). In the slab across the tumor, there was substantial generation of lactate within 4 sec after encoding. There also appears to be some negative imaginary pyruvate created over TM, which could be generated by the back-reaction from encoded lactate to pyruvate.

In order to validate this embodiment in vivo, saturation pulses were applied to lactate prior to the MAD-STEAM sequence, which is shown in FIG. 5C. Different TEs were chosen such that the expected phase of generated lactate would be either $$\Delta\phi_{pyr\to lac} = 0 \text{ or } \frac{\pi}{2}.$$

In both experiments, the generated lactate appeared in the real or imaginary channel, as expected by the chosen TE.

Variable Phase RF Pulses

In other embodiments of the invention, the use of variable phase RF pulses can provide additional spectral encoding in order to increase the flexibility of generating phase shifts in the stimulated-echo. Some examples of variable phase pulse profiles include minimum, maximum, and quadratic phase, and more complex phase profiles can readily be generated using Shinnar-Le Roux design approaches as described in "Parameter Relations for the Shinnar-Le Roux Selective Excitation Pulse Design Algorithm," by John Pauly et al, IEE Trans. Med. Imaging 1991; 10:53-65, which is incorporated by reference for all purposes, along with complex filter design techniques such as described in "Complex Chebyshev Approximation for FIR Filter Design," by L J Karam et al. IEEE Transactions on Circuits and Systems II: Analog and Digital Signal Processing 1995; 42:207-16, which is incorporated by reference for all purposes.

If the three 90° RF pulses in a stimulated-echo formation have spectral phase profiles of $\rho_1(f), \rho_2(f), \rho_3(f)$, the initial encoding is described by $$M_{enc}(\vec{x},f) = M_0 \cos(\psi(\vec{x}) + \hat{\phi}_E(f))\hat{z} \quad (12)$$

$$\hat{\phi}_E(f) = \phi(f) - \rho_1(f) + \rho_2(f) + \pi, \quad (13)$$

and the rephasing function is $$R(\hat{x}, f) = \exp(i(\psi(\hat{x}) + \hat{\phi}_R(f))) \quad (14)$$

$$\hat{\phi}_R(f) = \phi(f) + \rho_3(f) + \frac{\pi}{2}. \quad (15)$$

This results in a received phase shift between spins that were present at the encoding and those generated during the mixing time of $$\Delta\hat{\phi}(f_{enc} \to f_{final}) = \hat{\phi}_R(f_{final}) - \hat{\phi}_E(f_{enc}) - (\hat{\phi}_R(f_{final}) - \hat{\phi}_E(f_{final})) \quad (16)$$
$$= 2\pi(f_{final} - f_{enc})T\,E/2 + \ldots$$
$$(\rho_1(f_{enc}) - \rho_1(f_{final})) -$$
$$(\rho_2(f_{enc}) - \rho_2(f_{final})).$$

In comparing Eq. 16 to Eq. 10, using pulses with variable phase profiles provides additional degrees of freedom by which to modulate the phase shift for the received MAD-STEAM signal. This flexibility is advantageous primarily for monitoring multiple isotope flux pathways. For example, $[1-^{13}C]$-pyruvate undergoes metabolic conversion to $[1-^{13}C]$-lactate, $[1-^{13}C]$-alanine, and $^{13}C$-bicarbonate. Without variable phase pulses, there is only a single degree of freedom, TE, in Eq. 10 to generate a phase shift. This allows for only a single metabolic conversion pathway to be detected, as in Eq. 11 (except for the exceptional case in which, for different metabolic products, $$\frac{f_{met2} - f_{pyr}}{f_{met2} - f_{pyr}} = \frac{k_2 + 1/2}{k_2 + 1/2} \quad (17)$$

can be solved for integers $k_1, k_2$ that result in TE values on the order or less than $T_2$). However, with variable phase pulses, one could design encoding pulses in conjunction with choosing TE using the constraints that $$(\rho_1(f_{pyr}) - \rho_1(f_{met})) - (\rho_2(f_{pyr}) - \rho_2(f_{met})) + 2\pi(f_{met} - f_{pyr})T\,E/2 = x/2 + k\pi \quad (18)$$

for met=lac, ala, bic. One approach would be to choose a long enough TE to accomodate the pulses and gradients, use an initial pulse with constant phase, $\rho_1(f) = 0$, and in the second pulse set $\rho_2(f_{pyr}) = 0$, which reduces the problem to designing an appropriate variable phase profile for the second RF pulse:

$$\rho_2(f_{met}) = \frac{\pi}{2} + k\pi - 2\pi(f_{met} - f_{pyr})T\,E/2. \quad (19)$$

Super Stimulated-Echo

In another embodiment, MAD-STEAM is improved using a super stimulated-echo, which is an approach that uses RF pulse trains instead of the 90 pulses for improved SNR. For MAD-STEAM, this technique is applied by replacing the 90-90 encoding pulses with an RF pulse train, which can be designed using sampled inversion pulses. With this approach, the magnetization encoding is:

$$M_{enc}(\vec{x},f) = M_0 Q(\psi(\vec{x}) + \phi_Q(f))\hat{z}, \quad (20)$$

where $Q(\cdot)$ is a $2\pi$-periodic, even function that approximates a square-wave ($\mathrm{sign}(\cos(\rho))$) and the spectral encoding $\phi_Q(f)$ depends on the time between pulses as well as the pulse train phase. Since $Q(\cdot)$ is $2\pi$-periodic, even, and $\int_{-\pi}^{\pi} Q(x)dx = 0$, we can represent it as a Fourier series:

$$Q(x) = \sum_{n=1}^{\infty} a_n \cos(nx) \quad (21)$$

$$a_n = \frac{1}{\pi} \int_{-\pi}^{\pi} Q(x) \cos(nx) dx \quad (22)$$

A final 90° excitation pulse and refocusing (Eq. 14), results in $$m_{final}(\vec{x}, f_{enc} \to f_{final}) = \quad (23)$$
$$\frac{1}{2} M_0 \sum_{n=1}^{\infty} a_n \Big[ \exp\big(i((n+1)\psi(\vec{x}) + n\phi_Q(f_{enc}) + \hat{\phi}_R(f_{final}))\big) +$$
$$\exp\big(i((-n+1)\psi(\vec{x}) - n\phi_Q(f_{enc}) + \hat{\phi}_R(f_{final}))\big) \Big].$$

All terms in the summation where $n+1 \neq 0$ and $-n+1 \neq 0$ integrate to zero across the voxel volume, which leaves only one term in the resulting signal equation:

$$S_Q(f_{enc} \to f_{final}) = M_0 \frac{a_1}{2} \exp\big(i(\hat{\phi}_R(f_{final}) - \phi_Q(f_{enc}))\big). \quad (24)$$

Thus the phase offset for is preserved when using a super stimulated-echo encoding. Note that if $Q(\cdot)$ is an ideal square-wave, then $$\frac{a_2}{2} \approx 0.64,$$

which represents a 28% SNR improvement over a conventional stimulated-echo.

Generalized Embodiment

Figure 6:
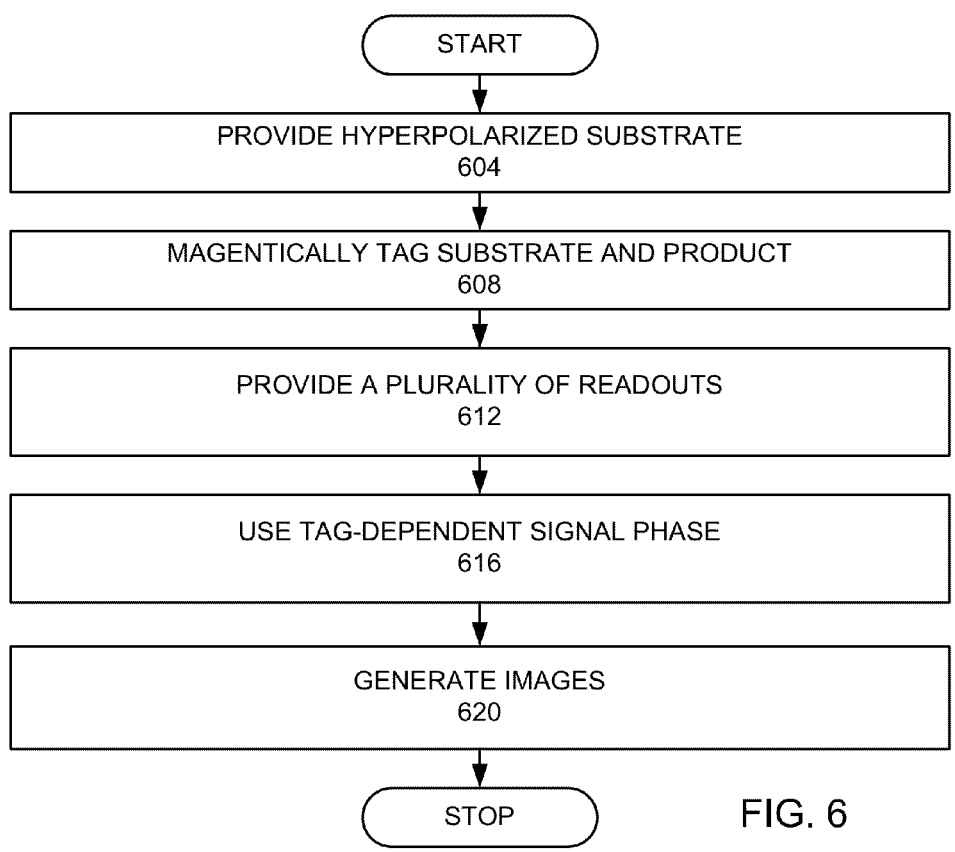
FIG. 6 is a high level flow chart of a generalized embodiment of the invention.

FIG. 6 is a high level flow chart of a generalized embodiment of the invention. In this embodiment a hyperpolarized substrate is provided to a localized volume (step 604). Providing hyperpolarized $^{13}C$ containing substrate may be provided by purifying $^{13}C$ containing substrate and cooling the sample to less than 3° K and then irradiated to increase the signal as much as 80,000 times. Because in this embodiment the substrate is a hyperpolarized $^{13}C$ containing molecule, the product is a $^{13}C$ containing molecule. An injection of the hyperpolarized substrate may be used. The substrate and product are magnetically tagged (step 608). The magnetic tagging of the substrate and product uses at least one magnetic gradient, where magnetic tagging provides a tag-dependent signal phase for the substrate and a different tag-dependent signal phase for the product. A plurality of readouts is provided (step 612). The plurality of readouts of magnetically tagged substrate and product are provided over time. The tag-dependent signal phase is used to determine magnetically tagged substrate that has transformed to product and magnetically tagged product that has been transformed to substrate over time (step 616). A plurality of images is generated (step 620). Preferably, an image is generated for each readout to provide a plurality of sequential images to form a cine. Preferably, the plurality of readouts comprises at least 3 readouts. Preferably, providing the readouts comprises providing a plurality of pulsed excitations, providing a magnetic gradient, and reading a spectral decomposition.

Preferably, the magnetically tagging of the substrate and product are confined to a localized volume. It is also preferred that the magnetically tagging the substrate and product comprises providing nonspectrally selective pulses with adjusted timing between pulses so that the tag-dependent signal phase of the substrate has a phase difference from the tag-dependent signal phase of the product.

Figure 7:
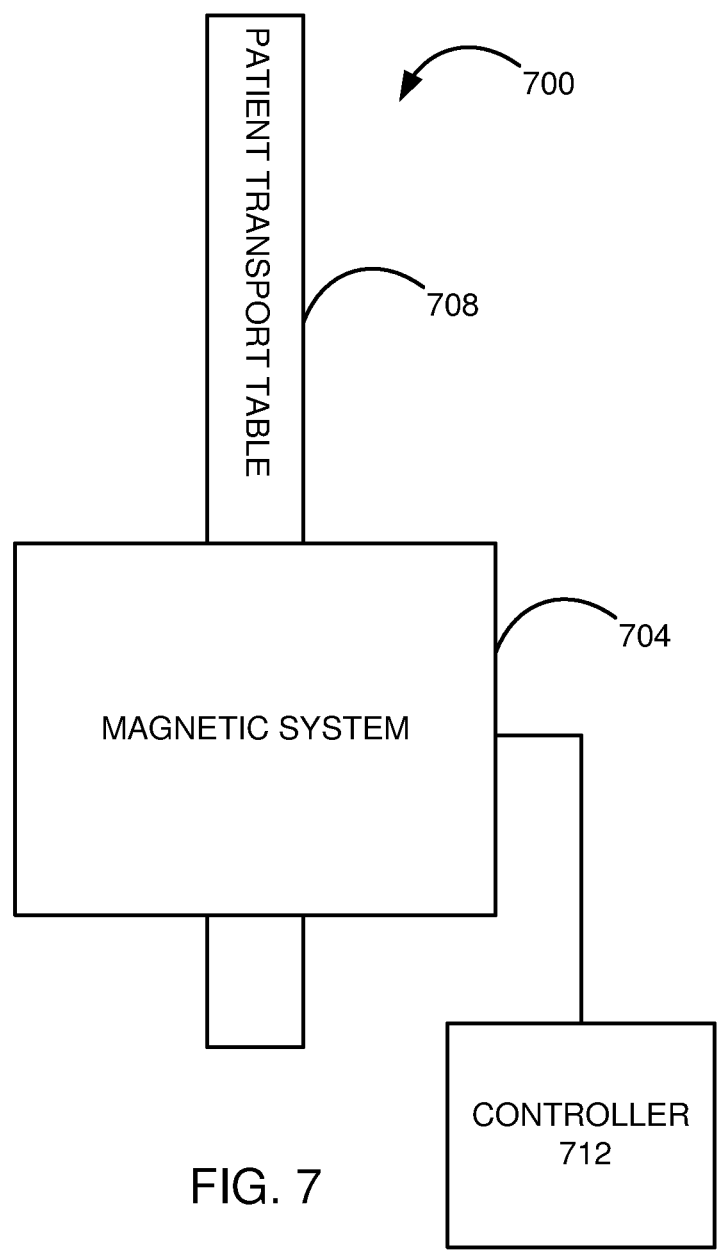
FIG. 7 is a schematic top view of a magnetic resonance imaging (MRI) system that may be used in an embodiment of the invention.

FIG. 7 is a schematic top view of a magnetic resonance imaging (MRI) system 700 that may be used in an embodiment of the invention. The MRI system 700 comprises a magnet system 704, a patient transport table 708 connected to the magnet system, and a controller 712 controllably connected to the magnet system. In one example, a patient would lie on the patient transport table 708 and the magnet system 704 would pass around the patient. The controller 712 would control magnetic fields and radio frequency (RF) signals provided by the magnet system 704 and would receive signals from detectors in the magnet system 704.

Figure 8:
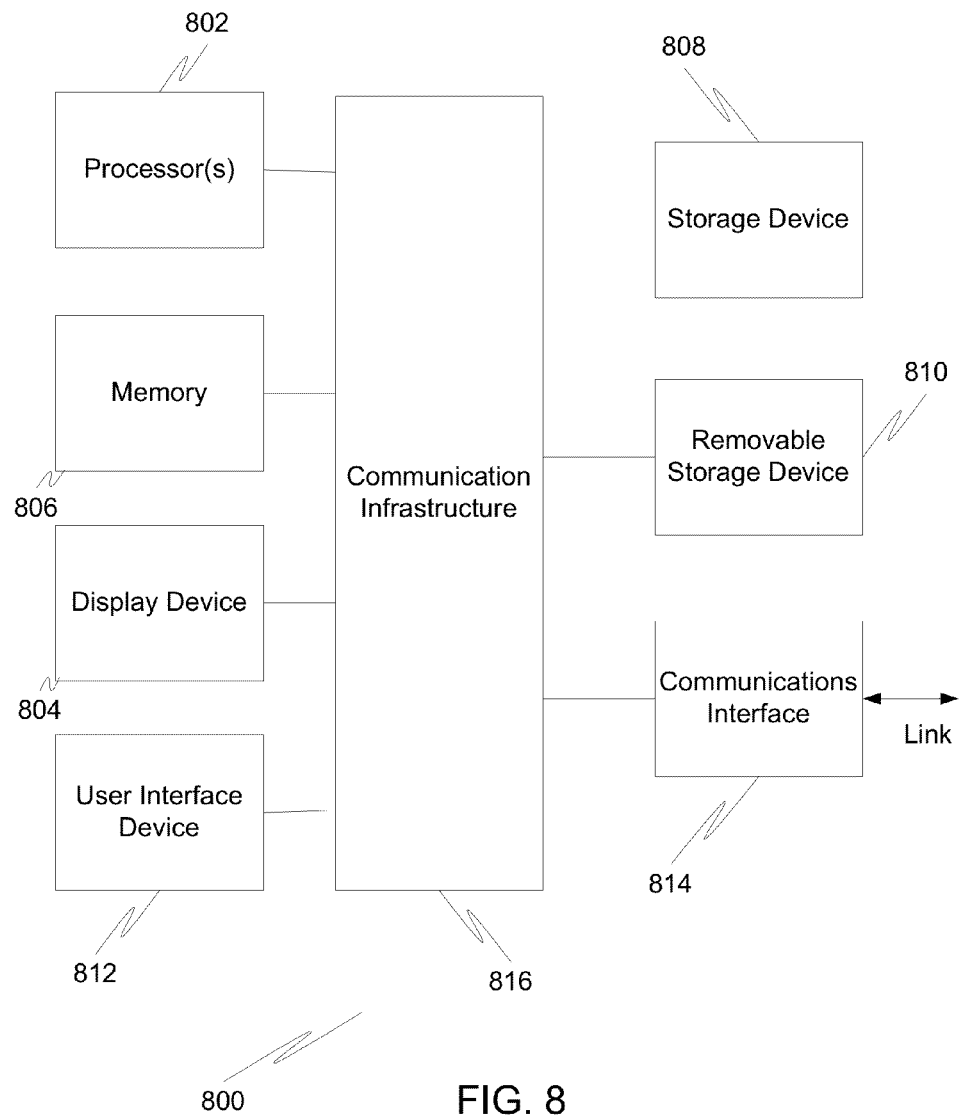
FIG. 8 illustrates a computer system that may be used in an embodiment of the invention.

FIG. 8 is a high level block diagram showing a computer system 800, which is suitable for implementing a controller 712 used in embodiments of the present invention. The computer system may have many physical forms ranging from an integrated circuit, a printed circuit board, and a small handheld device up to a huge super computer. The computer system 800 includes one or more processors 802, and further can include an electronic display device 804 (for displaying graphics, text, and other data), a main memory 806 (e.g., random access memory (RAM)), storage device 808 (e.g., hard disk drive), removable storage device 810 (e.g., optical disk drive), user interface devices 812 (e.g., keyboards, touch screens, keypads, mice or other pointing devices, etc.), and a communication interface 814 (e.g., wireless network interface). The communication interface 814 allows software and data to be transferred between the computer system 800 and external devices via a link. The system may also include a communications infrastructure 816 (e.g., a communications bus, cross-over bar, or network) to which the aforementioned devices/modules are connected.

Information transferred via communications interface 814 may be in the form of signals such as electronic, electromagnetic, optical, or other signals capable of being received by communications interface 814, via a communication link that carries signals and may be implemented using wire or cable, fiber optics, a phone line, a cellular phone link, a radio frequency link, and/or other communication channels. With such a communications interface, it is contemplated that the one or more processors 802 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

By measuring tagged substrate and tagged product, the process is better localized by not measuring untagged substrate and untagged product that has flowed into the local volume from outside of the local volume possibly by blood flow, since only substrate and product originally in the local volume is tagged. Therefore, in the analysis of a tumor an embodiment of the invention is able to measure product and substrate produced in the tumor instead of substrate or product produced elsewhere in the body that flows to the tumor. Generally, the magnetic spin tagging is able to last for minutes. This allows the measurement of conversion of tagged substrate to tagged product and tagged product to tagged substrate in the local volume. In an embodiment of the invention, the tagging of the substrate and product provides a 90° phase separation between the substrate and product, so that any substrate measured with a product tag is known to have been converted from the product to the substrate in the localized volume.

In one embodiment, tagging may be provided about 30 seconds after injection to allow the substrate to form products, which will be tagged. After tagging, readouts may then occur over 30 seconds with a readout out every five seconds. At least three images are generated. More preferably, a readout is provided every second. Images may then be generated for each readout, to form a 30 second motion picture or cine of the tagged substrate and tagged product.

In another embodiment a single readout may be used to create a single image. In this embodiment, the single readout is performed after a wait time after the tagging. The wait time allows for metabolic conversion. The single image would then include substrate, product, product generated from substrate, and substrate generated from product created during the wait time.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method for imaging a substrate and product over time, comprising:
   magnetically tagging the substrate and product with at least one magnetic gradient where magnetically tagging provides a tag-dependent signal phase for the substrate and a different tag-dependent signal phase for the product;
   providing at least one readout of magnetically tagged substrate and product over time; and
   using tag-dependent signal phase to determine product that has been transformed from magnetically tagged substrate and substrate that has been transformed from magnetically tagged product over time.

2. The method, as recited in claim 1, wherein the magnetically tagging the substrate and product is confined to a localized volume.

3. The method, as recited in claim 2, wherein the magnetically tagging the substrate and product comprises providing nonspectrally selective pulses with adjusted timing between pulses so that the tag-dependent signal phase of the substrate has a phase difference from the tag-dependent signal phase of the product.

4. The method, as recited in claim 3, wherein the providing the at least one readout provides at least 3 readouts wherein at least one readout is provided every five seconds.

5. The method, as recited in claim 4, wherein the providing the at least one readout comprises:
   providing a plurality of pulsed excitations;
   providing a magnetic gradient; and
   reading a spectral decomposition.

6. The method, as recited in claim 5, further comprising:
   hyperpolarizing the substrate; and
   providing the hyperpolarized substrate to the localized volume.

7. The method, as recited in claim 6, wherein the providing the hyperpolarized substrate to the localized volume, comprises injecting the hyperpolarized substrate into the localized volume.

8. The method, as recited in claim 7, wherein the substrate and product are hyperpolarized $^{13}C$, $^{1}H$, $^{3}He$, $^{6}Li$, $^{15}N$, $^{89}Y$, or $^{129}Xe$ containing molecules.

9. The method, as recited in claim 8, further comprising generating an image from each readout, so that the at least 3 readouts provide a plurality of sequential images.

10. The method, as recited in claim 1, wherein the magnetically tagging the substrate and product comprises providing nonspectrally selective pulses with adjusted timing between pulses so that the tag-dependent signal phase of the substrate has a phase difference from the tag-dependent signal phase of the product.

11. The method, as recited in claim 1, wherein the providing the at least one readout provides at least 3 readouts wherein at least one readout is provided every five seconds.

12. The method, as recited in claim 11, wherein the providing the at least one readout comprises:
   providing a plurality of pulsed excitations;
   providing a magnetic gradient; and
   reading a spectral decomposition.

13. The method, as recited in claim 1, further comprising:
   hyperpolarizing the substrate; and
   providing the hyperpolarized substrate to the localized volume.

14. The method, as recited in claim 13, wherein the providing the hyperpolarized substrate to the localized volume, comprises injecting the hyperpolarized substrate into the localized volume.

15. The method, as recited in claim 13, wherein the substrate and product are hyperpolarized $^{13}C$, $^{1}H$, $^{3}He$, $^{6}Li$, $^{15}N$, $^{89}Y$, or $^{129}Xe$ containing molecules.

16. The method, as recited in claim 1, wherein the at least one readout comprises a plurality of readouts, further comprising generating an image from each readout, so that the plural of readouts provide a plurality of sequential images.

* * * * *